United States Patent
Ma et al.

(10) Patent No.: US 9,128,126 B2
(45) Date of Patent: Sep. 8, 2015

(54) OSCILLOSCOPE AND METHOD, SYSTEM THEREOF FOR COLLECTING AND DISPLAYING SIGNAL WAVEFORM

(75) Inventors: Guangming Ma, Shenzhen (CN); Zhenying Wang, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 828 days.

(21) Appl. No.: 13/499,938

(22) PCT Filed: Oct. 20, 2010

(86) PCT No.: PCT/CN2010/077923
§ 371 (c)(1),
(2), (4) Date: Apr. 3, 2012

(87) PCT Pub. No.: WO2011/097895
PCT Pub. Date: Aug. 18, 2011

(65) Prior Publication Data
US 2012/0203500 A1 Aug. 9, 2012

(30) Foreign Application Priority Data
Feb. 9, 2010 (CN) .......................... 2010 1 0125723

(51) Int. Cl.
G01R 13/02 (2006.01)
G01R 31/28 (2006.01)

(52) U.S. Cl.
CPC ............ *G01R 13/02* (2013.01); *G01R 31/2836* (2013.01)

(58) Field of Classification Search
CPC ...................................... G01R 13/02
See application file for complete search history.

(56) References Cited

U.S. PATENT DOCUMENTS

| 5,550,483 A * | 8/1996 | Boyette et al. ........... 324/750.22 |
| 2004/0059536 A1 * | 3/2004 | Chang et al. ................. 702/120 |
| 2009/0024341 A1 | 1/2009 | Li et al. |

FOREIGN PATENT DOCUMENTS

| CN | 1614676 A | 5/2005 |
| CN | 101413968 A | 4/2009 |
| CN | 101788579 A | 7/2010 |
| JP | 04-184174 | 7/1992 |
| JP | 08-050163 | 2/1996 |
| JP | 2007199019 A | 8/2007 |

OTHER PUBLICATIONS

International Search Report for PCT/CN2010/077923, English translation attached to original, Both Completed by the Chinese Patent Office on Dec. 30, 2010, All together 8 Pages.

* cited by examiner

*Primary Examiner* — Mischita Henson
(74) *Attorney, Agent, or Firm* — Brooks Kushman P.C.

(57) ABSTRACT

An oscilloscope and a method and system thereof for collecting and displaying signal waveform are disclosed, including a control measuring unit determining a corresponding test command and test parameter according to the selection of test points on a tested object; calculating position coordinate of each test point, and sending the test command and test parameter to an automatic collecting unit; the automatic collecting unit returning test signals of each test point collected by a collecting probe of the automatic collection unit to the control measuring unit according to the test command and test parameter; and the control measuring unit generating corresponding waveform data according to the test signals returned by the automatic collecting unit, storing and displaying the waveform data.

16 Claims, 3 Drawing Sheets

OSCILLOSCOPE AND METHOD, SYSTEM THEREOF FOR COLLECTING AND DISPLAYING SIGNAL WAVEFORM

CROSS-REFERENCE TO RELATED APPLICATION

This application is the U.S. national phase of PCT Appln. No. PCT/CN2010/077923 filed Oct. 20, 2010 which claims priority to Chinese Application No. 201010125723.6 filed on Feb. 9, 2010, the disclosures of which are incorporated in their entirety by reference herein.

TECHNICAL FIELD

The present invention relates to the field of collection and test of signals of electronic products, and particularly, to an oscilloscope and a method, a system for collecting and displaying signal waveform.

BACKGROUND OF THE RELATED ART

Currently, oscilloscopes, either the mid-end, high-end or low-end oscilloscopes, adopted in hardware testing field of electronic products all adopt a traditional manual way of hand-held probe to collect tested signals.

With the development of technology, the density and complexity of the Print Circuit Board (PCB) in the electronic products are getting higher and higher, the working speed becomes faster and faster, and the margins of signal integrity, timing sequence and power integrity are getting smaller and smaller. To guarantee the product quality, it is often required to comprehensively test the power clock and key signals in the design and development stage of the product.

For a circuit board connected with several or even tens of thousands Nets (of which the number represents the complexity of the circuit board), if the screening, probe contact and testing of a test signal are completed by using handworks and human eyes, not only the amount of work is extremely large, but also a test fault or a test error will be brought in due to an unreliable contact of the hand-operated probe, and even the test probe will be damaged due to an improper press of the manual operation. On the other hand, as the efficiency of manual test is low, the test time will often be unbearable if all the key signals are tested, thus only part of signals which are representative in the key signals are selected to be tested, which easily leads to missing a key test. The work of arranging the test report is also very heavy due to numerous test data, and that is because the report always can not correspond to a PCB diagram, thus people have to look up the PCB diagram and elementary diagram when reading the test report, thereby also making the readability of the report worse.

As can be seen from the above, the use of the oscilloscopes which adopt the traditional manual way of hand-held probe and the method thereof for collecting waveform has been far from adequate to collect signal waveforms on the circuit board of high-end products, thus a high-reliability, high-speed and high-efficiency oscilloscope which can be applicable to comprehensively testing the high-end products and a method thereof for collecting and displaying the signal waveform should be provided in pertinence.

SUMMARY OF THE INVENTION

The technical problem to be solved by the present invention is to provide an oscilloscope and a method, a system thereof for collecting and displaying signal waveform, which can automatically control the positioning of a point to be tested of a tested object and the collection and display of the signal waveform.

To solve the above technical problem, the present invention provides a method for collecting and displaying signal waveform, which relates to a control measuring unit and an automatic collecting unit, and the method comprises:

the control measuring unit determining a corresponding test command and test parameter according to the selection of test points on a tested object, calculating position coordinates of each test point, and sending the test command and the test parameter to the automatic collecting unit;

the automatic collecting unit returning test signals of each test point collected by a collecting probe to the control measuring unit according to the test command and test parameter;

the control measuring unit generating corresponding waveform data according to the test signals returned by the automatic collecting unit, storing and displaying the waveform data.

The control measuring unit determining the corresponding test command and test parameter according to the selection of test points on the tested object comprises: the control measuring unit selecting a corresponding type of collecting probe according to variety, frequency and amplitude of signals of each test point of the tested object, and setting test parameters of vertical and/or horizontal and triggering of each data channel;

the step of the control measuring unit calculating the position coordinates of each test point comprises: calculating out the position coordinates of each test point according to detected original position coordinates of the tested object;

the step of the control measuring unit sending the test command and test parameter to the automatic collecting unit comprises: sending the test command and test parameter at least including the position coordinates of the test point and the test command and test parameter of a selected probe to the automatic collecting unit;

the step of the automatic collecting unit returning the test signals of each test point collected by the collecting probe to the control measuring unit according to the test command and test parameter comprises: the automatic collecting unit sending the selected probe to a specified position according to the position coordinates of the test point in the test command, carrying the probe to a specified position coordinate to contact with a corresponding test point by forming a multi-coordinate motion trajectory, and returning the test signals collected by the probe to the control measuring unit;

the step of the control measuring unit generating corresponding waveform data according to the test signals returned by the automatic collecting unit, storing and displaying the waveform data comprises: the control measuring unit receiving the test signals of one or more test points returned by the automatic collecting unit through one or more set data channels, generating the corresponding waveform data, and storing and displaying the waveform data.

The step of the control measuring unit calculating the position coordinates of each test point further comprises: the control measuring unit detecting the original position coordinates of the tested object through optical positioning;

the multi-coordinate motion trajectory formed by the automatic collecting unit comprises any one of the spatial rectangular three-coordinate motion trajectory or polar coordinate motion trajectory, or the plane rectangular coordinate motion trajectory or polar coordinate motion trajectory;

the step of the control measuring unit displaying the waveform data comprises: controlling displaying the waveform data of the corresponding channel according to a human-computer interaction command, and/or implementing an associated display with a design document of the tested object according to the waveform data.

To solve the above technical problem, the present invention provides an oscilloscope, which comprises a control measuring unit and an automatic collecting unit, wherein:

the control measuring unit is configured to: determine a corresponding test command and test parameter according to the selection of test points on a tested object, calculate position coordinates of the test points; and send the test command and test parameter to the automatic collecting unit; and generate corresponding waveform data according to test signals returned by the automatic collecting unit, store and display the waveform data;

the automatic collecting unit is configured to: return the collected test signals of each test point to the control measuring unit according to the test command and test parameter.

The control measuring unit comprises: a comprehensive controlling unit and a signal measuring and waveform data generating unit, and the automatic collecting unit comprises: a collecting probe servo unit and one or more collecting probes, wherein:

the comprehensive controlling unit is configured to: select test points of the tested object, calculate position coordinates of the test points according to the original position coordinates of the tested object, and send the corresponding test command and test parameter thereof;

the collecting probe servo unit is configured to: carry the supported and borne collecting probe to specified position coordinates to contact with the corresponding test point according to the corresponding test command and the test parameter thereof, and transfer the test signals returned by the collecting probe to the signal measuring and waveform data generating unit;

the collecting probe is configured to: collect the test signals of the test point under the servo control of the collecting probe servo unit, and return the test signals to the collecting probe servo unit;

the signal measuring and waveform data generating unit is configured to: complete a test configuration according to the corresponding test command and test parameter thereof, receive the test signals of the test point transferred by the collecting probe servo unit through one or more channels, and generate the waveform data of a corresponding channel.

The control measuring unit further comprises a tested object positioning unit, wherein:

the tested object positioning unit is configured to: collect the original position coordinates of the tested object according to the corresponding test command and test parameter thereof, and return the original position coordinates of the tested object to the comprehensive controlling unit.

The comprehensive controlling unit is further configured to: select a corresponding type of collecting probe according to one or more attributes of the variety, frequency and amplitude of the signals of each test point of the tested object;

the collecting probe servo unit is configured to carry the supported and borne collecting probe to the specified position coordinates to contact with the corresponding test point according to a following way: carrying the collecting probe selected by the comprehensive controlling unit to be under the position coordinates through a formed multi-coordinate motion trajectory under control of the comprehensive controlling unit, and guaranteeing a good contact; the multi-coordinate motion trajectory comprising any one of spatial rectangular three-coordinate motion trajectory or polar coordinate motion trajectory, or plane rectangular coordinate motion trajectory or polar coordinate motion trajectory.

The comprehensive controlling unit is further configured to: set test parameters of verticalness and/or horizon and triggering of each channel of the signal measuring and waveform data generating unit according to one or more attributes of variety, frequency and amplitude of signals of each test point of the tested object; receive and store waveform data transferred by the signal measuring and waveform data generating unit;

the signal measuring and waveform data generating unit is further configured to: transfer the generated waveform data of each channel to the comprehensive controlling unit.

The control measuring unit further comprises a human-computer interaction unit, wherein:

the human-computer interaction unit is configured to: provide the variety of the collecting probe and the information of the tested object and test point thereof under the control of the comprehensive controlling unit, and transfer a human-computer interaction command to the comprehensive controlling unit; and display the waveform data of the corresponding channel under the control of the comprehensive controlling unit;

the comprehensive controlling unit is further configured to: control the human-computer interaction unit to display the waveform data according to the human-computer interaction command; and/or implement an associated display with design document of the tested object according to the waveform data.

To solve the above technical problem, the present invention provides a system for collecting and displaying signal waveform, wherein, the system comprises: a calculating and controlling device, a signal measuring and waveform data generating device, a collecting probe servo device and one or more collecting probes, wherein:

the calculating and controlling device is configured to: select a test point of a tested object, calculate position coordinates of the test point, and send a corresponding test command and test parameter thereof;

the collecting probe servo device is configured to: carry a supported and borne collecting probe to a specified position coordinate to contact with a corresponding test point according to the corresponding test command and test parameter thereof, and transfer test signals returned by the collecting probe to the signal measuring and waveform data generating device;

the collecting probe is configured to: collect the test signals of the test point under the servo control of the collecting probe servo unit, and return the test signals of the test point to the collecting probe servo device;

the signal measuring and waveform data generating device is configured to: complete a test configuration according to the corresponding test command and test parameter thereof, receive the test signals of the test point transferred by the collecting probe servo device through one or more channels, and generate waveform data.

A tested object positioning device is further comprised, wherein:

the tested object positioning device is configured to: collect original position coordinates of the tested object according to the corresponding test command and test parameter thereof, and return the original position coordinates of the tested object to the calculating and controlling device;

the calculating and controlling device is configured to calculate the position coordinates of the test point according to following ways: calculating the position coordinates of a selected test point according to the original position coordinates of the tested object returned by the tested object positioning device.

The calculating and controlling device is further configured to: select a corresponding type of collecting probe according to one or more attributes of the variety, frequency and amplitude of the signals of each test point of the tested object;

the collecting probe servo device is configured to carry the supported and borne collecting probe to the specified position coordinates to contact with the corresponding test point according to a following way: carrying the collecting probe selected by the calculating and controlling device to be under the position coordinates through a formed multi-coordinate motion trajectory under control of the comprehensive controlling unit, and guaranteeing a good contact by exerting an appropriate force on the collecting probe; the multi-coordinate motion trajectory comprising any one of a spatial rectangular three-coordinate motion trajectory or polar coordinate motion trajectory, or a plane rectangular coordinate motion trajectory or polar coordinate motion trajectory.

The calculating and controlling device is further configured to: set test parameters of verticalness and/or horizon and triggering of each channel of the signal measuring and waveform data generating unit according to one or more attributes of variety, frequency and amplitude of the signals of each test point of the tested object; receive and store the waveform data transferred by the signal measuring and waveform data generating device;

the signal measuring and waveform data generating device is further configured to: transfer the generated waveform data of each channel to the calculating and controlling device.

The calculating and controlling device comprises a human-computer interaction device, wherein:

the human-computer interaction device is configured to: provide the variety of the collecting probe and the information of the tested object and test point thereof, and transfer a human-computer interaction command, and display the waveform data of the corresponding channel;

the calculating and controlling device is further configured to: control the human-computer interaction device to display the waveform data according to the human-computer interaction command; and/or implement an associated display with design document of the tested object according to the waveform data.

The system further comprises a tested object fixing device, which is configured to: fix or unfix the tested object under the control of the calculating and controlling device.

The present invention overcomes the problems and defects existing in the above traditional oscilloscope, and provides an oscilloscope and a corresponding system and method, which accurately positions and contacts the test point of the tested object by automatically controlling one or multiple collecting probes, so as to collect, store and display the signal waveform of the test point automatically. Meanwhile, the test results can also be directly displayed on the corresponding PCB diagram. The present invention is especially applicable to the comprehensive test and batch consistency test of the high-density and complicated PCB, and can save a large amount of test labor, which greatly improves the efficiency, accuracy and reliability of the test and shortens the development cycle of the hardware.

PREFERRED EMBODIMENTS OF THE PRESENT INVENTION

The technical scheme of the present invention will be elaborated in detail in combination with the accompanying drawings and preferred examples below. The examples illustrated as follows are only used to describe and explain the present invention, which does not intend to limit the technical scheme of the present invention.

Figure 1:
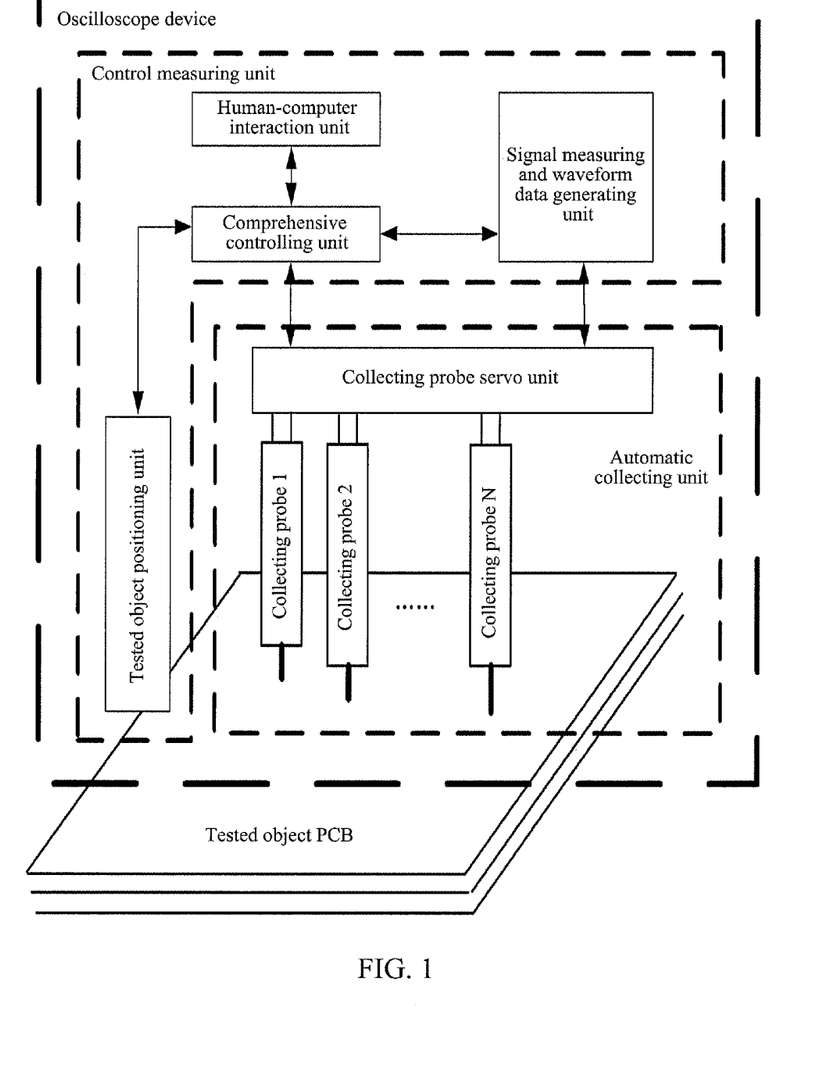
FIG. 1 is a structural schematic diagram of the example of oscilloscope device according to the present invention.

As shown in FIG. 1, it is a structure of the example of oscilloscope device, which can automatically position, collect and display the signal waveform of a test point, provided by the present invention, and the oscilloscope device comprises a control measuring unit and an automatic collecting unit, wherein:

the control measuring unit is used to: determine a corresponding test command and test parameter according to the selection of test points on a tested object; calculate position coordinates of each test point on the tested object according to original position coordinates of the tested object, send the test command and the test parameter to the automatic collecting unit, generate corresponding waveform data according to test signals collected by the automatic collecting unit, and store and display the waveform data;

the automatic collecting unit is used to: return the collected test signals of each test point to the control measuring unit according to the test command and test parameter which are sent by the control measuring unit;

the control measuring unit also implements an associated display with design document of the test object according to the generated waveform data.

In FIG. 1, the control measuring unit further comprises: a comprehensive controlling unit, a tested object positioning unit and a signal measuring and waveform data generating unit, and the automatic collecting unit further comprises: a collecting probe servo unit and one or more collecting probes, wherein:

the comprehensive controlling unit is used to: set test parameters of verticalness and/or horizon and triggering and so on of each channel of the signal measuring and waveform data generating unit according to the variety, frequency and amplitude of the signals of each test point of the tested object, and send the test command and transfer the test parameter to the tested object positioning unit, signal measuring and waveform data generating unit, and collecting probe servo unit respectively;

the comprehensive controlling unit calculates the position coordinates of a target test point on the tested object according to the position coordinate of the tested object transferred by the tested object positioning unit, and selects a corresponding type of probe; and sends the corresponding test command and test parameter thereof to the signal measuring and waveform data generating unit and the collecting probe servo unit respectively according to the calculated position coordinates of the test point and the selected probe.

The comprehensive controlling unit also receives and stores test data from the signal measuring and waveform data generating unit, and records the test data on a PCB diagram of a corresponding tested object (such as a circuit board, bare machine or semi-finished product of the electronic products and so on).

The tested object positioning unit is used to: collect the original position coordinate of the tested object according to the test command and test parameter thereof, and transfer the original position coordinate of the tested object to the comprehensive controlling unit;

the tested object positioning unit collects the original position coordinate of the tested object, for example, in the way of optical scanning.

The signal measuring and waveform data generating unit is used to: complete a test configuration according to the test command and test parameter thereof, receive the test signals of the test point detected by one or more collecting probes and transferred by the collecting probe servo unit via one or more channels, generate the waveform data accordingly, and transfer the generated test data of each channel to the comprehensive controlling unit at the same time;

the collecting probe servo unit is used to: support and bear one or more collecting probes, form a multi-coordinate motion trajectory under the control of the comprehensive controlling unit, carry the collecting probe to the specified position coordinate to contact with the test point, and transfer the test signals of the test point collected by the collecting probe to the signal measuring and waveform data generating unit;

the collecting probe servo unit also exerts an appropriate force on the collecting probe to guarantee a good contact between the probe and test point.

The multi-coordinate motion trajectory formed by the collecting probe servo unit is a spatial rectangular three-coordinate (x, y, z) motion trajectory or polar coordinate (r, α, β) motion trajectory; or is a plane rectangular coordinate (x, y) motion trajectory or polar coordinate (r, α) motion trajectory.

One or more collecting probes are used to: implement an accurate positioning and contact with the test point of the tested object (i.e. the PCB) under the control of the multi-coordinate motion trajectory of the collecting probe servo unit, and output the test signals collected from the test point to the collecting probe servo unit.

The above oscilloscope device further comprises a human-computer interaction unit, which is used to: provide the variety of the collecting probe and the information of the tested object and test point thereof under the control of the comprehensive controlling unit, and transfer a human-computer interaction command to the comprehensive controlling unit; the comprehensive controlling unit controls the human-computer interaction unit to display the waveform of the corresponding channel according to the human-computer interaction command.

One or more collecting probes of the present invention can adapt to the requirements of the signals of various test points with different frequencies, amplitudes and earthing conditions. After arriving at the specified coordinates and implementing a contact with the signal of the test point, each collecting probe can perform the test in sequence, and also can perform the test in parallel, to improve the test efficiency.

Figure 2:
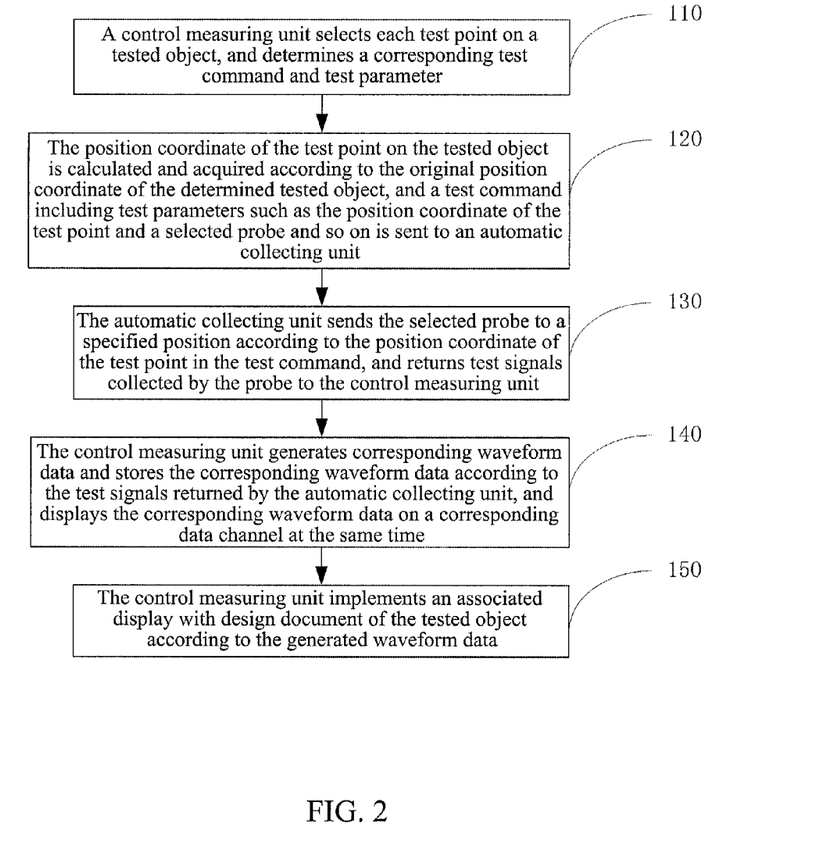
FIG. 2 is a flow chart of the example of method for collecting and displaying signal waveform according to the present invention.

As shown in FIG. 2, it is a flow of the example of method of using the oscilloscope provided by the present invention to collect and display signal waveform, and the following steps are comprised.

In step 110, a control measuring unit selects each test point on a tested object, and determines a corresponding test command and test parameter.

The control measuring unit firstly fixes the respective positions of the tested object and collecting probe servo device relatively.

The tested object for example is a print circuit board (PCB), bare machine or semi-finished product of the electronic products and so on.

In step 120, the position coordinate of the test point on the tested object is calculated and acquired according to the determined initial position coordinate of the tested object, and a test command including other test parameters such as the position coordinate of the test point and a selected probe and so on is sent to the automatic collecting unit.

The control measuring unit detects the initial position coordinate of the tested object, and selects the test point on the tested object; acquires a signal parameter of the test point, and thus sets the waveform to display test parameters of verticalness or horizon and triggering and so on of each channel, and selects a corresponding type of probe.

Here, the detection of the initial position coordinate of the tested object comprises detecting the initial position coordinates of the tested object through the optical positioning of a tested object positioning device. The signal parameter of the test point includes one or multiple kinds of the parameters of signal variety, frequency and amplitude, and is acquired through the design document (e.g., the PCB diagram) of the tested object or through a human-computer interface.

In step 130, the automatic collecting unit sends the selected probe to a specified position according to the position coordinate of the test point in the test command, and returns test signals collected by the probe to the control measuring unit.

The automatic collecting unit forms a multi-coordinate motion trajectory under the control of the control measuring unit to send the selected probe to the specified position, which for example is the spatial rectangular three-coordinate (x, y, z) motion trajectory or polar coordinate (r, α, β) motion trajectory; or is the plane rectangular coordinate (x, y) motion trajectory or polar coordinate (r, α) motion trajectory. The automatic collecting unit makes the probe and test point in a good electrical contact.

In step 140, the control measuring unit generates corresponding waveform data according to the test signals returned by the automatic collecting unit and stores the corresponding waveform data, which are displayed on corresponding data channels at the same time.

In step 150, the control measuring unit implements an associated display with design document of the tested object according to the generated waveform data.

The control measuring unit for example records the index of the received waveform data on the PCB diagram of the corresponding tested object.

If the signal collection of a next test point also needs to be performed, the next test point can be selected, and the above steps 120~150 are repeated.

The above method further comprises a step: a human-computer interaction unit of the control measuring unit provides the variety of the collecting probe and the information of the tested object and test point thereof, and transfers a human-computer interaction command to the control measuring unit; the control measuring unit controls the human-computer interaction unit to display waveform of the corresponding channel according to the human-computer interaction command.

Figure 3:
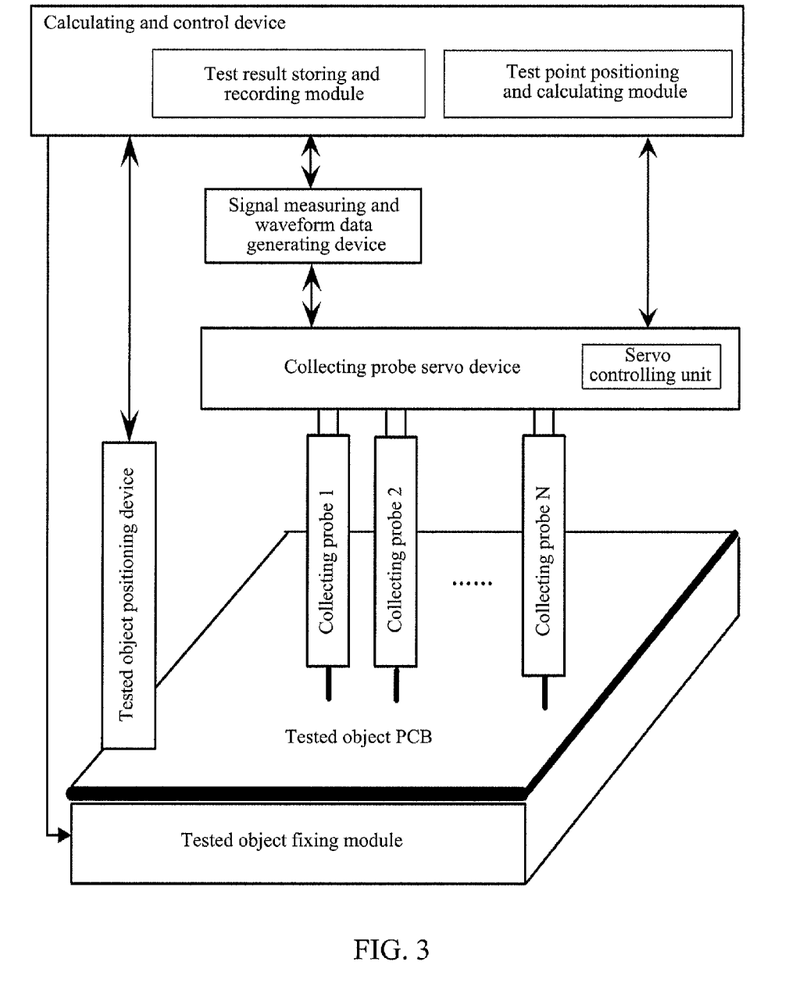
FIG. 3 is a structural schematic diagram of the example of system for collecting and displaying signal waveform according to the present invention.

As shown in FIG. 3, it is a structure of the example of system, which can automatically position, collect and display signal waveform of a test point, provided by the present invention, and the system comprises: a calculating and controlling device, a signal measuring and waveform data generating device, a tested object positioning device, a collecting probe servo device and one or more collecting probes, wherein:

the calculating and controlling device is used to: set test parameters of verticalness and/or horizon and triggering and so on of each channel of the signal measuring and waveform data generating device according to the variety, frequency and amplitude of the signals of each test point of the tested object, and send a test command and transfer a test parameter to the tested object positioning device, signal measuring and waveform data generating device, and the collecting probe servo device respectively;

the calculating and controlling device selects a test point of the tested object and calculates the position coordinate of the test point through a positioning and calculating device of the test point according to the original position coordinates of the tested object transferred by the tested object positioning unit, and selects a corresponding type of probe; and sends the corresponding test command and test parameter thereof to the signal measuring and waveform data generating device and the collecting probe servo device respectively according to the calculated position coordinate of the test point and the selected probe.

The calculating and controlling device also receives and stores test data from the signal measuring and waveform data generating device through a test result storing and recording device, and records the test data on the PCB diagram of the corresponding tested object (such as a circuit board, bare machine or semi-finished product of the electronic products and so on).

The tested object positioning device is used to: transfer the collected original position coordinate of the tested object to the calculating and controlling device according to the test command and test parameter thereof;

the tested object positioning device for example collects the original position coordinate of the tested object in the way of optical scanning.

The signal measuring and waveform data generating device is used to: complete a test configuration according to the test command and test parameter thereof, receive and display the test signals of the test point detected by one or more collecting probes and transferred by the collecting probe servo device through one or more channels, generate the waveform data, and transfer the generated test data of each channel to the calculating and controlling device at the same time.

The collecting probe servo device is used to: support and bear one or more collecting probes, form a multi-coordinate motion trajectory according to the test command and test parameter thereof, carry the collecting probe to a specified position coordinate to contact with a test point, and transfer the test signals of the test point collected by the collecting probe to the signal measuring and waveform data generating device;

the collecting probe servo device also exerts an appropriate force on the collecting probe to guarantee a good contact between the probe and the test point.

The collecting probe servo unit forms a multi-coordinate motion trajectory through a servo controlling unit, and the multi-coordinate motion trajectory for example is a spatial rectangular three-coordinate (x, y, z) motion trajectory or polar coordinate (r, α, β) motion trajectory, or is a plane rectangular coordinate (x, y) motion trajectory or polar coordinate (r, α) motion trajectory.

One or more collecting probes are used to: implement an accurate positioning and contact with the test point of the tested object under the control of the multi-coordinate motion trajectory of the collecting probe servo device, and output the test signals collected from the test point to the collecting probe servo device.

The above system provides the variety of the collecting probe and the information of the tested object and test point thereof through a human-computer interaction device (not shown in the figure, such as a keyboard and an output display screen and so on) in the calculating and controlling device, and transfer a human-computer interaction command at the same time; the calculating and controlling device controls the human-computer interaction device to display the waveform of the corresponding channel according to the human-computer interaction command.

The system shown in FIG. 3 further comprises a tested object fixing device, which is used to fix or unfix the tested object under the control of the calculating and controlling device, such as the tested object is clamped or unclamped through a forcipated cramp, or is locked or unlocked through a push lock, etc.

In the example, the calculating and controlling device can pre-select each test point in batch on the design documents such as the PCB diagram of the tested object and so on, controls by a program the collecting probe servo device to automatically and accurately position the collecting probe to the test point, inputs and stores the waveform data generated by the signal measuring and waveform data generating device, and directly records the test results on the PCB diagram.

The present invention replaces the method for implementing the collection and display of signal waveform through the manually hand-held probe in the traditional oscilloscope, and makes signal waveform of the tested signals, in a way of a batch pre-selection on the design documents such as PCB diagram, be automatically input and stored into the oscilloscope through a multi-coordinate collecting probe controlled by the program, and directly record the test results on the PCB diagram. Therefore, the present invention is especially applicable to the comprehensive test and batch consistency test of the high-density and complicated PCB of the high-end product and may save a large amount of test labor, which greatly improves the efficiency, accuracy and reliability of the test, thereby effectively shortening the development cycle of the hardware.

Though the preferred examples of the present invention have been disclosed for the purpose of instantiation, the skilled in the art will realize that various improvements, increments and replacements are also possible. Therefore, the scope of the present invention should not be limited to the above examples.

The ordinary skilled in the art can understand that all or part of steps in the above method can be completed by a program instructing related hardware, and the program can be stored in a computer readable memory medium, such as a read-only memory, disk or optical disk and so on. Alternatively, all or part of steps of the above examples can also be implemented by using one or multiple integrated circuits. Correspondingly, each module/unit in the above examples can be implemented in a form of hardware, and can also be implemented in a form of software function module. The present invention is not limited to any combination of hardware and software in a specific form.

INDUSTRIAL APPLICABILITY

The present invention overcomes the problems and defects existing in the above traditional oscilloscope, and provides an oscilloscope and a corresponding system and method, which accurately collects, stores and displays signal waveform of the test point by automatically controlling one or multiple collecting probes to accurately position and contact with the test point of the tested object. Meanwhile, the test results can also be directly displayed on the corresponding PCB diagram. The present invention is especially applicable to the comprehensive test and batch consistency test of a high-density and complicated PCB and can save a large amount of test labor, which greatly improves the efficiency, accuracy and reliability of the test and shortens the development cycle of the hardware.

What is claimed is:

1. A method for collecting and displaying signal waveform, by at least one processor configured as a control measuring unit and an automatic collecting unit, the method comprising:

the control measuring unit determining a corresponding test command and test parameter according to selection of test points on a tested object, calculating a position coordinate of each test point, and sending the test command and the test parameter to the automatic collecting unit;

the automatic collecting unit returning test signals of each test point collected by a collecting probe to the control measuring unit according to the test command and the test parameter; and the control measuring unit generating corresponding waveform data according to the test signals returned by the automatic collecting unit, storing and displaying the waveform data;

wherein, the control measuring unit determining the corresponding test command and the test parameter according to the selection of test points on the tested object comprises: the control measuring unit selecting a corresponding type of collecting probe according to variety, frequency and amplitude of signals of each test point of the tested object, and setting test parameters of vertical and/or horizontal and triggering of each data channel;

the control measuring unit calculating the position coordinate of each test point comprises: calculating out the position coordinate of each test point according to detected original position coordinate of the tested object;

the control measuring unit sending the test command and the test parameter to the automatic collecting unit comprises: sending the test command and test parameter including at least the position coordinate of the test point and the selected probe to the automatic collecting unit;

the automatic collecting unit returning the test signals of each test point collected by the collecting probe to the control measuring unit according to the test command and test parameter comprises: the automatic collecting unit sending the selected probe to a specified position according to the position coordinate of the test point in the test command, carrying the probe to a specified position coordinate to contact with the corresponding test point by forming a multi-coordinate motion trajectory, and returning the test signals collected by the probe to the control measuring unit; and the control measuring unit generating corresponding waveform data according to the test signals returned by the automatic collecting unit, storing and displaying the waveform data comprises: the control measuring unit receiving the test signals of one or more test points returned by the automatic collecting unit through one or more set data channels, generating the corresponding waveform data, and storing and displaying the waveform data.

2. The method according to claim 1, wherein, the control measuring unit calculating the position coordinate of each test point further comprises: the control measuring unit detecting the original position coordinate of the tested object through optical positioning;

the multi-coordinate motion trajectory formed by the automatic collecting unit comprises any one of spatial rectangular three-coordinate motion trajectory or polar coordinate motion trajectory, or plane rectangular coordinate motion trajectory or polar coordinate motion trajectory; and the control measuring unit displaying the waveform data comprises: controlling displaying the waveform data of the corresponding channel according to a human-computer interaction command, and/or implementing an associated display with a design document of the tested object according to the waveform data.

3. An oscilloscope, comprising at least one processor configured as a control measuring unit and an automatic collecting unit, wherein:

the control measuring unit is configured to: determine a corresponding test command and test parameter according to selection of test points on a tested object, calculate position coordinates of the test points; and send the test command and the test parameter to the automatic collecting unit; and generate corresponding waveform data according to test signals returned by the automatic collecting unit, store and display the waveform data; and the automatic collecting unit is configured to: return the collected test signals of each test point to the control measuring unit according to the test command and the test parameter;

wherein, the control measuring unit comprises a comprehensive controlling unit and a signal measurement and waveform data generating unit, and the automatic collecting unit comprises a collecting probe servo unit and one or more collecting probes, the comprehensive controlling unit is configured to: select the test point of the tested object, calculate position coordinate of the test point according to original position coordinate of the tested object, and send the corresponding test command and the test parameter thereof;

the collecting probe servo unit is configured to: carry the supported and borne collecting probe to a specified position coordinate to contact with the corresponding test point according to the corresponding test command and the test parameter thereof, and transfer the test signals returned by the collecting probe to the signal measuring and waveform data generating unit;

the collecting probe is configured to: collect the test signals of the test point under the servo control of the collecting probe servo unit and return the test signals to the collecting probe servo unit; and the signal measuring and waveform data generating unit is configured to: complete a test configuration according to the corresponding test command and the test parameter thereof, receive the test signals of the test point transferred by the collecting probe servo unit through one or more channels, and generate waveform data of the corresponding channel.

4. The oscilloscope according to claim 3, wherein, the control measuring unit further comprises a tested object positioning unit, the tested object positioning unit is configured to: collect the original position coordinate of the tested object according to the corresponding test command and test parameter thereof, and return the original position coordinate of the tested object to the comprehensive controlling unit.

5. The oscilloscope according to claim 4, wherein, the comprehensive controlling unit is further configured to: set test parameters of verticalness and/or horizon and triggering of each channel of the signal measuring and waveform data generating unit according to one or more attributes of variety, frequency and amplitude of signals of each test point of the tested object; receive and store waveform data transferred by the signal measuring and waveform data generating unit;

the signal measurement and waveform data generating unit is further configured to: transfer the generated waveform data of each channel to the comprehensive controlling unit.

6. The oscilloscope according to claim 4, wherein, the control measuring unit further comprises a human-computer interaction unit, the human-computer interaction unit is configured to: provide variety of the collecting probe and information of the tested object and test point thereof under control of the comprehensive controlling unit, and transfer a human-computer interaction command to the comprehensive controlling unit; and display the waveform data of a corresponding channel under the control of the comprehensive controlling unit;

the comprehensive controlling unit is further configured to: control the human-computer interaction unit to display the waveform data according to the human-computer interaction command; and/or implement an associated display with a design document of the tested object according to the waveform data.

7. The oscilloscope according to claim 3, wherein, the comprehensive controlling unit is further configured to: select a corresponding type of collecting probe according to one or more attributes of variety, frequency and amplitude of signals of each test point of the tested object; and the collecting probe servo unit is configured to carry the supported and borne collecting probe to the specified position coordinate to contact with the corresponding test point according to a following way: carrying the collecting probe selected by the comprehensive controlling unit to be under the position coordinate through a formed multi-coordinate motion trajectory under control of the comprehensive controlling unit, and guaranteeing a good contact; the multi-coordinate motion trajectory comprising any one of spatial rectangular three-coordinate motion trajectory or polar coordinate motion trajectory, or plane rectangular coordinate motion trajectory or polar coordinate motion trajectory.

8. The oscilloscope according to claim 7, wherein, the comprehensive controlling unit is further configured to: set test parameters of verticalness and/or horizon and triggering of each channel of the signal measuring and waveform data generating unit according to one or more attributes of variety, frequency and amplitude of signals of each test point of the tested object; receive and store waveform data transferred by the signal measuring and waveform data generating unit;

the signal measurement and waveform data generating unit is further configured to: transfer the generated waveform data of each channel to the comprehensive controlling unit.

9. The oscilloscope according to claim 7, wherein, the control measuring unit further comprises a human-computer interaction unit, the human-computer interaction unit is configured to: provide variety of the collecting probe and information of the tested object and test point thereof under control of the comprehensive controlling unit, and transfer a human-computer interaction command to the comprehensive controlling unit; and display the waveform data of a corresponding channel under the control of the comprehensive controlling unit;

the comprehensive controlling unit is further configured to: control the human-computer interaction unit to display the waveform data according to the human-computer interaction command; and/or implement an associated display with a design document of the tested object according to the waveform data.

10. The oscilloscope according to claim 3, wherein, the comprehensive controlling unit is further configured to: set test parameters of verticalness and/or horizon and triggering of each channel of the signal measuring and waveform data generating unit according to one or more attributes of variety, frequency and amplitude of signals of each test point of the tested object; receive and store waveform data transferred by the signal measuring and waveform data generating unit; and the signal measurement and waveform data generating unit is further configured to: transfer the generated waveform data of each channel to the comprehensive controlling unit.

11. The oscilloscope according to claim 3, wherein, the control measuring unit further comprises a human-computer interaction unit, the human-computer interaction unit is configured to: provide variety of the collecting probe and information of the tested object and test point thereof under control of the comprehensive controlling unit, and transfer a human-computer interaction command to the comprehensive controlling unit; and display the waveform data of a corresponding channel under the control of the comprehensive controlling unit; and the comprehensive controlling unit is further configured to: control the human-computer interaction unit to display the waveform data according to the human-computer interaction command; and/or implement an associated display with a design document of the tested object according to the waveform data.

12. A system for collecting and displaying signal waveform, comprising: a calculating and controlling device, a signal measuring and waveform data generating device, a collecting probe servo device and one or more collecting probes, wherein:

the calculating and controlling device comprises at least one processor which is configured to: select a test point of a tested object, calculate a position coordinate of the test point, and send a corresponding test command and test parameter thereof;

the collecting probe servo device comprises at least one processor which is configured to: carry a supported and borne collecting probe to a specified position coordinate to contact with a corresponding test point according to the corresponding test command and test parameter thereof, and transfer test signals returned by the collecting probe to the signal measuring and waveform data generating device;

the collecting probe is configured to: collect the test signals of the test point under servo control of the collecting probe servo unit, and return the test signals of the test point to the collecting probe servo device; and the signal measuring and waveform data generating device comprises at least one processor which is configured to: complete a test configuration according to the corresponding test command and test parameter thereof, receive the test signals of the test point transferred by the collecting probe servo device through one or more channels, and generate waveform data;

wherein, the system further comprising a tested object positioning device, wherein:

the tested object positioning device comprises at least one processor which is configured to: collect a original position coordinate of the tested object according to the corresponding test command and test parameter thereof, and return the original position coordinate of the tested object to the calculating and controlling device; and the calculating and controlling device is configured to calculate the position coordinate of the test point according to a following way: calculating the position coordinate of a selected test point according to the original position coordinate of the tested object returned by the tested object positioning device.

13. The system according to claim 12, wherein, the calculating and controlling device is further configured to: select a corresponding type of the collecting probe according to one or more attributes of variety, frequency and amplitude of signals of each test point of the tested object;

the collecting probe servo device is configured to carry the supported and borne collecting probe to the specified position coordinate to contact with the corresponding test point according to a following way: carrying the collecting probe selected by the calculating and controlling device to be under the position coordinate through a formed multi-coordinate motion trajectory under control of the comprehensive controlling unit, and guaranteeing a good contact by exerting an appropriate force on the collecting probe; the multi-coordinate motion trajectory comprising any one of a spatial rectangular three-coordinate motion trajectory or polar coordinate motion trajectory, or a plane rectangular coordinate motion trajectory or polar coordinate motion trajectory.

14. The system according to claim 12, wherein, the calculating and controlling device is further configured to: set test parameters of verticalness and/or horizon and triggering of each channel of the signal measuring and waveform data generating unit according to one or more attributes of variety, frequency and amplitude of the signals of each test point of the tested object; receive and store the waveform data transferred by the signal measuring and waveform data generating device;

the signal measuring and waveform data generating device is further configured to: transfer the generated waveform data of each channel to the calculating and controlling device.

15. The system according to claim 12, wherein, the calculating and controlling device comprises a human-computer interaction device, wherein:

the human-computer interaction device comprises at least one processor which is configured to: provide the variety of the collecting probe and information of the tested object and test point thereof, transfer a human-computer interaction command, and display the waveform data of the corresponding channel; and the calculating and controlling device is further configured to: control the human-computer interaction device to display the waveform data according to the human-computer interaction command; and/or implement an associated display with a design document of the tested object according to the waveform data.

16. The system according to claim 12, the system further comprising a tested object fixing device, wherein, the tested object fixing device comprises at least one processor which is configured to: fix or unfix the tested object under control of the calculating and controlling device.

* * * * *